(12) United States Patent
Surthi et al.

(10) Patent No.: US 8,502,294 B1
(45) Date of Patent: Aug. 6, 2013

(54) SEMICONDUCTOR PROCESS AND SEMICONDUCTOR STRUCTURE FOR MEMORY ARRAY WITH BURIED DIGIT LINES (BDL)

(75) Inventors: Shyam Surthi, Boise, ID (US); Lars Heineck, Garden City, ID (US)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 13/471,464

(22) Filed: May 15, 2012

(51) Int. Cl.
*H01L 27/108* (2006.01)

(52) U.S. Cl.
USPC ........... 257/301; 438/243; 438/246; 438/387; 257/E27.092; 257/E29.346; 257/E21.396

(58) Field of Classification Search
USPC ................. 438/243, 244, 246, 387; 257/301, 257/E27.092, E29.346, E21.396
See application file for complete search history.

(56) References Cited

U.S. PATENT DOCUMENTS

| 5,629,226 A * | 5/1997 | Ohtsuki | 438/389 |
| 2004/0007728 A1 * | 1/2004 | Chang et al. | 257/301 |

* cited by examiner

*Primary Examiner* — Brook Kebede
(74) *Attorney, Agent, or Firm* — Jianq Chyun IP Office

(57) ABSTRACT

A semiconductor process for a memory array with buried digit lines is described. A first trench is formed in a semiconductor substrate. A liner layer is formed on the sidewall of the first trench. A second trench is formed in the substrate under the first trench. A mask layer is formed at the bottom of the second trench. An isotropic doping process is performed using the liner layer and the mask layer as a mask to form a digit-side junction only in the substrate at the sidewall of the second trench.

20 Claims, 3 Drawing Sheets

SEMICONDUCTOR PROCESS AND SEMICONDUCTOR STRUCTURE FOR MEMORY ARRAY WITH BURIED DIGIT LINES (BDL)

BACKGROUND OF THE INVENTION

1. Field of Invention

This invention relates to a semiconductor process and a semiconductor structure for a memory array with buried digit lines (BDL).

2. Description of Related Art

A typical memory array, such as a DRAM or flash memory array, includes word lines and bit lines crossing the word lines, and may utilize vertical MOS transistors to achieve $4F^2$ cells. For the $4F^2$ cell, the BDL design is important, wherein each buried digit line in the substrate is coupled to a digit-side junction (source) that acts as a part of a vertical MOS transistor.

FIG. 1 illustrates a conventional process of forming digit-side junctions of BDL-type memory array. A plurality of deep trenches 110 are formed in a substrate 100, a plurality of doped regions 120 are formed in the substrate 100 near the bottom of the trenches 110, and the substrate 100 is subjected to a long drive-in step to drive the doped regions 120 into larger digit-side junctions 130 that overlap with the word lines 140 formed subsequently. Due to the long drive-in step, the junction depth increases significantly and causes at least the issues below: difficulty in the digitline-to-digitline separation, and higher digitline capacitance due to the taller junctions.

SUMMARY OF THE INVENTION

Accordingly, this invention provides a semiconductor process for a BDL-type memory array, which minimizes the junction out-diffusion at the trench bottom and thereby prevents at least the above two issues.

This invention also provides a semiconductor structure for a BDL-type memory array, which can be fabricated with the semiconductor process of this invention.

The semiconductor process for a BDL-type memory array of this invention is described as follows. A first trench is formed in a semiconductor substrate. A liner layer is formed on the sidewall of the first trench. A second trench is formed in the substrate under the first trench. A mask layer is formed at the bottom of the second trench. An isotropic doping process is performed using the liner layer and the mask layer as a mask to form a digit-side junction only in the substrate at the sidewall of the second trench.

In an embodiment, the step of forming the mask layer at the bottom of the second trench includes the following steps. A material layer is formed in the first and the second trenches, in a manner such that it is thicker at the bottom of the second trench than on the sidewall of the second trench. The material layer on the sidewall of the second trench and a portion of the material layer at the bottom of the second trench is then removed, wherein the remaining material layer at the bottom of the second trench serves as the mask layer.

The semiconductor structure for a BDL-type memory array of this invention includes a semiconductor substrate having therein a first trench and a second trench under the first trench, a liner layer disposed on the sidewall of the first trench, a mask layer disposed at bottom of the second trench, and a digit-side junction only in the substrate at the sidewall of the second trench.

In this invention, the depth of the digit-side junction relative to the word line formed later can be readily controlled by adjusting the respective depths of the first and second trenches, and the digit-side junction is formed with isotropic doping, so that no drive-in step is required to make the digit-side junction overlap with the word lines.

Therefore, the digitline-to-digitline separation is better than in the prior art. Moreover, because a mask layer is formed at the bottom of the second trench before the isotropic doping, no doped region is formed under the bottom of the second trench. Thus, the digit-side junction is shorter, and thus the digit-line capacitance is smaller.

In order to make the aforementioned and other objects, features and advantages of this invention comprehensible, a preferred embodiment accompanied with figures is described in detail below.

DESCRIPTION OF EMBODIMENTS

This invention is further explained with the following embodiment referring to the accompanying drawings, which is not intended to limit the scope of this invention.

FIGS. 2A-2E are cross-sectional diagrams illustrating a semiconductor process for a BDL-type memory array according to an exemplary embodiment of this invention.

Figure 1:
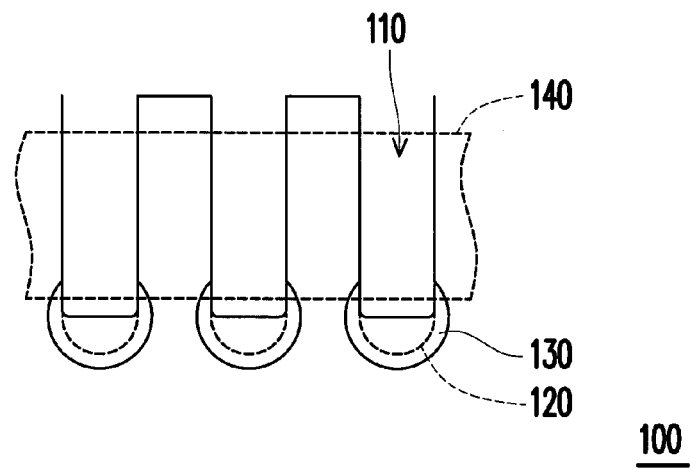
FIG. 1 is a cross-sectional diagram illustrating a conventional process of forming digit-side junctions (source regions) for a BDL-type memory array.
Figure 2A:
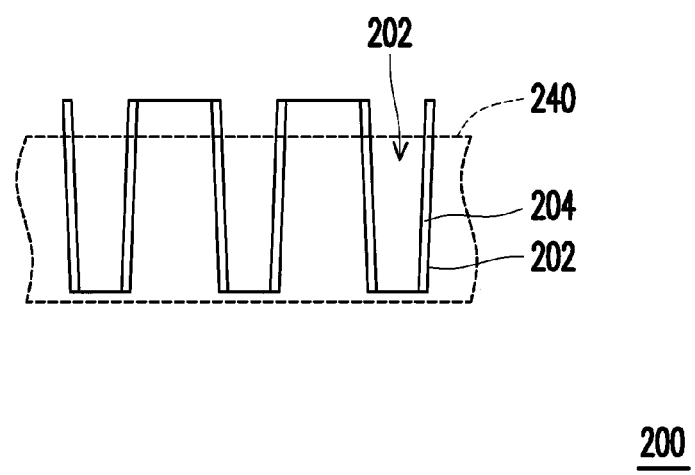
FIGS. 2A-2E are cross-sectional diagrams illustrating a semiconductor process for a BDL-type memory array according to an exemplary embodiment of this invention, wherein FIG. 2E also illustrates the resulting semiconductor structure.

Referring to FIG. 2A, a plurality of first trenches 202, each of which may have a tapered shape, is formed in a semiconductor substrate 200 that may be a lightly doped single-crystal silicon substrate. It is noted that the patterned mask layer for defining the first trenches 202 is not shown in this figure and the following figures for simplicity. Moreover, the position of the word lines 240 formed after the process of this invention is also illustrated in all figures for comparison. The bottoms of the word lines 240 may be deeper (as shown in the figures) or shallower than that of the first trenches 202.

A liner layer 204 is formed on the sidewall of each first trench 202. The liner layer 204 may include silicon oxide and/or silicon nitride, a composite layer composed of a silicon oxide film and/or a silicon nitride film, or other dielectric that can function as a mask to block the subsequent etching for forming second trenches under the first trenches 202 and block the even later isotropic doping. The liner layer 204 may be formed with deposition and subsequent anisotropic etching, and may have a thickness of about 2-20 nm.

Figure 2B:
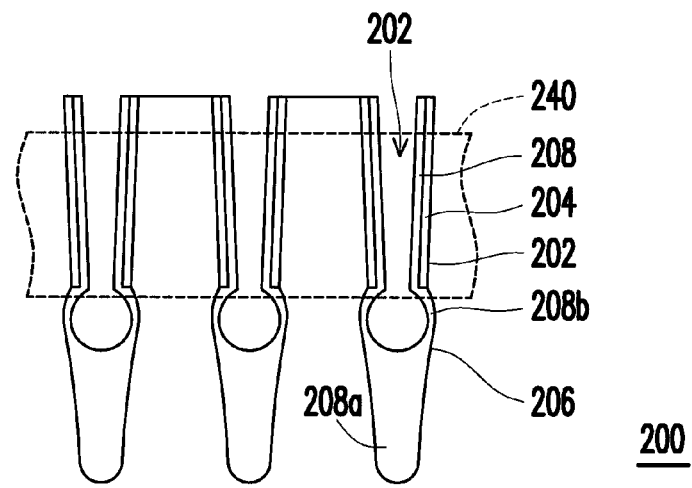

Referring to FIG. 2B, a plurality of second trenches 206 is formed each under a corresponding first trench 202 in the substrate 200 using the same patterned layer as a mask. The second trenches 206 are preferably formed with an etching process causing undercut in the substrate under the first trenches 202. Such etching process may be a combination of wet etch and dry etch. In an embodiment, the etching process includes a wet etching step creating a wider upper portion for each second trench 206, and a subsequent anisotropic dry etching step controlling the depth of each second trench 206.

Next, a material layer 208 is formed in the first trenches 202 and the second trenches 206, in a manner such that the portion 208a thereof at the bottom of each second trench 206 is thicker than the portion 208b thereof on the sidewall of each second trench 206 or first trench 202. Such material layer 208 may be formed by a directional high-density plasma chemical vapor deposition (HDP-CVD) process, and may include silicon oxide.

In an embodiment, the thickness of the portion 208a of the material layer 208 at the bottom of each second trench 206 is approximately 15-50 nm, and the thickness of the portion 208b of the material layer 208 on the sidewall of each second trench 206 or each first trench 202 is approximately 1-5 nm. Accordingly, when the portion 208b of the material layer 208 on the sidewall of each of the second trenches 206 and the first trenches 202 is completely removed, the portion 208a of the material layer 208 at the bottom of each second trench 206 still has a minimal thickness of approximately 10 nm.

Figure 2C:
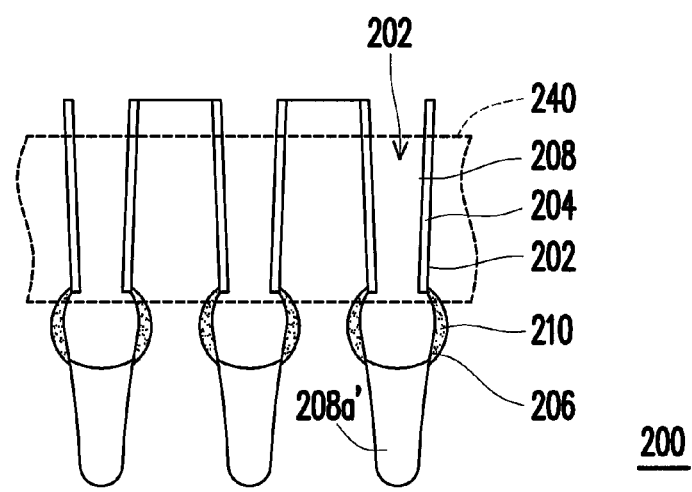

Referring to FIG. 2C, the portion 208b of the material layer 208 on the sidewall of each of the second trenches 206 and the first trenches 202 and a part of the portion 208a of the material layer 208 at the bottom of each second trench 206 are removed by an etching process, which is controlled such that the portions 208a' of the material layer 208 remain at the bottoms of the second trenches 206 to serve as a mask layer in the later isotropic doping. The mask layer 208a' may have a thickness greater than 5 nm. An isotropic doping process is then performed using the linear layer 204 and the mask layer 208a' as masks to form a plurality of digit-side junctions 210 only in the substrate 200 at the sidewalls of the second trenches 206, wherein each digit-side junction 210 is only in the substrate 200 at the sidewall of one second trench 206. The isotropic doping process may include a gas-phase doping process or a plasma-assisted doping process. A heat treatment step may be added to drive in the dopants to a desired location in the substrate 200.

Figure 2D:
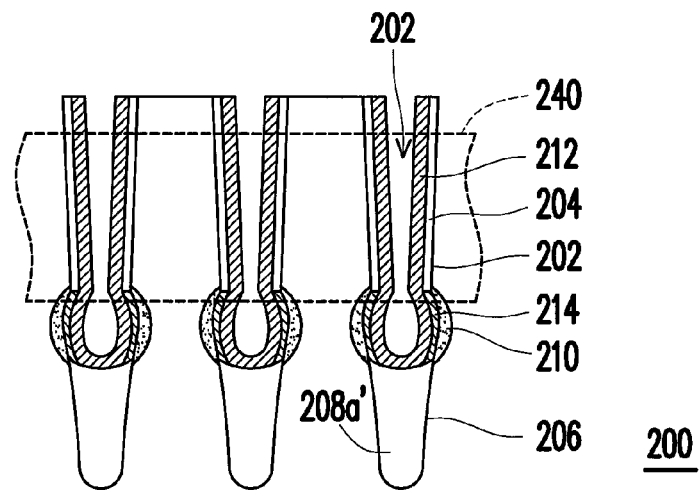

Referring to FIG. 2D, a refractory metal layer 212, such as a titanium (Ti) layer or a cobalt layer, etc., may be formed in the first trenches 202 and the second trenches 206. An annealing process is then performed to react the metal layer 212 with the surface silicon atoms on the sidewalls of the second trenches 206 and thereby form a salicide layer 214 on the sidewalls of the second trenches 206, wherein the liner layer 204 and the mask layer 208a' serve as a salicide block (SAB) layer. Another annealing process may be required to reduce the resistance of the salicide layer 214, depending on the species of the metal used.

Figure 2E:
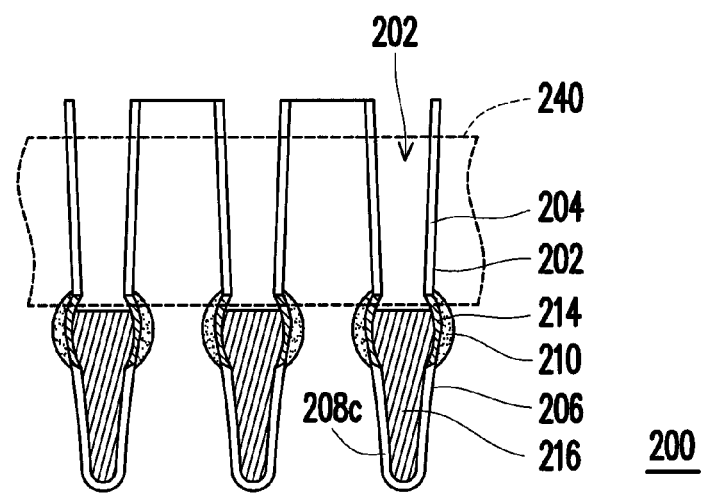

Referring to FIG. 2E, the unreacted metal layer 212 is removed by wet etching so that only the salicide layer 214 remains on the sidewalls of the second trenches 206.

Thereafter, an anisotropic etching process is performed to remove a portion of the mask layer 208a' and form a thin dielectric layer 208c, and buried digit lines 216 comprising a metal, such as TiN or W, etc., are formed in the second trenches 206 with deposition and etching-back. Then, a device isolation structure like a STI structure, a gate dielectric layer, and a plurality of word lines (240) usually perpendicular to the buried digit lines 216 can be formed. These processes are not described in details herein since they are known in the prior art.

FIG. 2E also illustrates the resulting semiconductor structure for a BDL-type memory array according to the above embodiment of this invention.

As shown in FIG. 2E, the semiconductor structure includes a semiconductor substrate 200 having therein a plurality of first trenches 202 and a plurality of second trenches 206 each under a first trench 202, a liner layer 204 disposed on the sidewall of each first trench 202, a mask layer 208a' disposed at the bottom of each second trench 206, a digit-side junction 210 only in the substrate 200 at the sidewall of each second trench 206, and a salicide layer 214 only on the sidewall of each second trench 206.

The thickness and the materials of the liner layer 204, the mask layer 208a' and the salicide layer may be the same as mentioned above.

In the above semiconductor process, the depth of the digit-side junctions 210 relative to the word lines 240 formed later can be controlled by adjusting the respective depths of each first trench 202 and each second trench 206, and the digit-side junctions 210 are formed with isotropic doping. Hence, no additional drive-in step is required after the above isotropic doping process to make the digit-side junctions 210 overlap with the word lines 240 formed later, and the digitline- to-digitline separation is better than in the prior art.

Moreover, because a mask layer 208a' is formed at the bottom of each second trench 206 before the isotropic doping, no doped region is formed in the substrate at the bottom of the second trench 206. Therefore, the digit-side junctions 210 are shorter, and the digit-line capacitance is smaller due to the shorter junctions 210.

Though in the above embodiment the buried digit lines include metal and a salicide layer 214 is formed on the sidewalls of the second trenches 206 to reduce the resistance between the digit-side junctions 210 and the buried digit lines, in another embodiment, the buried digit lines may include silicon only so that no silicide has to be formed on the silicon sidewalls of the second trenches 206.

Moreover, when the second trenches are formed with a larger depth, especially in cases where silicon digit lines are to be formed, the above process of directional oxide deposition and subsequent etching may be repeated at least one time to get very thick oxide capable of completely filling the bottom parts of the second trenches 206. The design of deep second trenches in combination with repetition of the above directional deposition-etching process is also applicable to the cases of metal digit lines.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A semiconductor process for a memory array with buried digit lines (BDL), comprising:
   forming a first trench in a semiconductor substrate;
   forming a liner layer on a sidewall of the first trench;
   forming a second trench in the substrate under the first trench;
   forming a mask layer at bottom of the second trench; and
   performing an isotropic doping process using the liner layer and the mask layer as a mask to form a digit-side junction only in the substrate at a sidewall of the second trench.

2. The semiconductor process of claim 1, wherein forming the mask layer at the bottom of the second trench comprises:
   forming, in the first trench and the second trench, a material layer that is thicker at the bottom of the second trench than on the sidewall of the second trench; and
   removing the material layer on the sidewall of the second trench and a portion of the material layer at the bottom of the second trench, wherein the remaining material layer at the bottom of the second trench serves as the mask layer.

3. The semiconductor process of claim 2, wherein the material layer is formed with a directional high-density plasma chemical vapor deposition (HDP-CVD) process.

4. The semiconductor process of claim 2, wherein the material layer comprises silicon oxide.

5. The semiconductor process of claim 2, wherein a thickness of the material layer as formed at the bottom of the second trench is within the range of 15-30 nm, and a thickness of the material layer as formed on the sidewall of the second trench is within the range of 1-5 nm.

6. The semiconductor process of claim 2, wherein the step of forming the material layer and the step of removing the material layer on the sidewall of the second trench and the portion of the material layer at the bottom of the second trench are repeated at least one time.

7. The semiconductor process of claim 1, wherein the mask layer comprises silicon oxide.

8. The semiconductor process of claim 1, wherein the isotropic doping process comprises a gas-phase doping process or a plasma-assisted doping process.

9. The semiconductor process of claim 1, wherein forming the second trench comprises an etching step that causes undercut in the substrate under the first trench.

10. The semiconductor process of claim 9, wherein the etching step comprises a wet etching step or a dry etching step.

11. The semiconductor process of claim 1, further comprising forming a salicide layer only on the sidewall of the second trench using the liner layer and the mask layer as a salicide block layer.

12. The semiconductor process of claim 11, further comprising forming a buried metal digit line in the second trench.

13. The semiconductor process of claim 12, wherein the buried metal digit line comprises TiN or W.

14. The semiconductor process of claim 1, further comprising forming a buried silicon digit line in the second trench.

15. The semiconductor process of claim 1, wherein the liner layer comprises a silicon oxide/silicon nitride composite layer.

16. A semiconductor structure for a memory array with buried digit lines (BDL), comprising:
 a semiconductor substrate, having therein a first trench, and a second trench under the first trench;
 a liner layer disposed on a sidewall of the first trench;
 a mask layer disposed at bottom of the second trench; and
 a digit-side junction only in the substrate at a sidewall of the second trench.

17. The semiconductor structure of claim 16, wherein the second trench has an undercut structure under the first trench.

18. The semiconductor structure of claim 16, further comprising a salicide layer only on the sidewall of the second trench.

19. The semiconductor structure of claim 16, wherein the mask layer comprises silicon oxide.

20. The semiconductor structure of claim 16, wherein the liner layer comprises a silicon oxide/silicon nitride composite layer.

* * * * *